(12) United States Patent
Baek et al.

(10) Patent No.: US 10,692,890 B2
(45) Date of Patent: Jun. 23, 2020

(54) DISPLAY DEVICE, STACKED SUBSTRATE INCLUDING THE SAME, AND METHOD FOR MANUFACTURING THE DISPLAY DEVICE

(71) Applicant: SAMSUNG DISPLAY CO., LTD., Yongin-si, Gyeonggi-Do (KR)

(72) Inventors: Gyungmin Baek, Yongin-si (KR); Juhyun Lee, Seongnam-si (KR); Sangwon Shin, Yongin-si (KR); Hyuneok Shin, Gwacheon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/273,554

(22) Filed: Feb. 12, 2019

(65) Prior Publication Data

US 2019/0259783 A1    Aug. 22, 2019

(30) Foreign Application Priority Data

Feb. 19, 2018    (KR) .......................... 10-2018-0019369

(51) Int. Cl.
| | |
|---|---|
| *H01L 21/00* | (2006.01) |
| *H01L 27/12* | (2006.01) |
| *H01L 27/32* | (2006.01) |
| *H01L 51/52* | (2006.01) |
| *H01L 51/00* | (2006.01) |

(Continued)

(52) U.S. Cl.
CPC ........ *H01L 27/1218* (2013.01); *H01L 25/048* (2013.01); *H01L 27/1266* (2013.01); *H01L 27/3276* (2013.01); *H01L 51/003* (2013.01); *H01L 51/0097* (2013.01); *H01L 51/5237* (2013.01); *H01L 51/56* (2013.01);

(Continued)

(58) Field of Classification Search
CPC ....................... H01L 27/1288; H01L 27/1266; H01L 25/048
See application file for complete search history.

(56) References Cited

U.S. PATENT DOCUMENTS

| | | | |
|---|---|---|---|
| 9,184,180 B2 | 11/2015 | Huh et al. | |
| 9,773,823 B2 | 9/2017 | Kang et al. | |
| 2018/0061639 A1* | 3/2018 | Yamazaki | ........... H01L 21/7806 |

FOREIGN PATENT DOCUMENTS

| | | |
|---|---|---|
| KR | 1020110042899 | 4/2011 |
| KR | 1020150009289 | 1/2015 |

(Continued)

*Primary Examiner* — Samuel A Gebremariam
(74) *Attorney, Agent, or Firm* — F. Chau & Associates, LLC

(57) ABSTRACT

A method for manufacturing a display device includes providing a carrier substrate and forming a soluble layer on the carrier substrate. The soluble layer includes a material that, dissolves in a washing solution. The method includes forming a cover layer on a top surface of the soluble layer and a side surface of the soluble layer. The method includes forming a display panel on the cover layer. The display panel includes a base layer. The method includes removing a portion of the cover layer from the side surface of the soluble layer to form a remaining part. The method includes providing the washing solution to the soluble layer to remove the soluble layer. The method includes separating the display panel and the remaining part from the carrier substrate.

13 Claims, 20 Drawing Sheets

(51) Int. Cl.
 *H01L 25/04* (2014.01)
 *H01L 51/56* (2006.01)
(52) U.S. Cl.
 CPC .. *H01L 27/3244* (2013.01); *H01L 2251/5338* (2013.01); *H01L 2251/566* (2013.01)

(56) References Cited

FOREIGN PATENT DOCUMENTS

| | | |
|---|---|---|
| KR | 1020160125584 | 11/2016 |
| KR | 101731116 | 4/2017 |

\* cited by examiner

DISPLAY DEVICE, STACKED SUBSTRATE INCLUDING THE SAME, AND METHOD FOR MANUFACTURING THE DISPLAY DEVICE

CROSS-REFERENCE TO RELATED APPLICATION

This U.S. non-provisional patent application claims priority under 35 U.S.C. § 119 to Korean Patent Application No. 10-2018-0019369, filed on Feb. 19, 2018, the disclosure of which is incorporated by reference herein in its entirety.

TECHNICAL FIELD

Exemplary embodiments of the present invention relate to a display device, and more particularly, to a stacked substrate including the same, and a method for manufacturing the display device.

DISCUSSION OF RELATED ART

Display panels may display images to provide a user with information. The display panels may include a base substrate and a display element disposed on the base substrate. The display device may generate an image according to an electrical signal.

Display panels may include a base substrate having flexibility, and thus a flexible display panel may be provided. The flexible display panel may be provided in such a manner in which a flexible base substrate is provided on a carrier substrate, and a display element may be disposed on the base substrate through depositing and patterning, and then the base substrate may be separated from the carrier substrate. To separate the base substrate from the carrier substrate, an irradiating process using a laser may be used.

SUMMARY

An exemplary embodiment of the present invention provides a stacked substrate, which is separated from a carrier substrate while omitting a separation process such as laser irradiation, and a method for manufacturing a display device. An exemplary embodiment of the present invention provides a display device including a base substrate that is separated from a carrier substrate in which an occurrence of damage to the display device is reduced or eliminated. For example, an occurrence of heat damage during a heat treatment process, such as a laser irradiation process, may be eliminated. Additionally, a manufacturing cost of the display device may be reduced.

An exemplary embodiment of the present invention provides a method for manufacturing a display device including providing a carrier substrate and forming a soluble layer on the carrier substrate. The soluble layer includes a material that dissolves in a washing solution. The method includes forming a cover layer on a top surface of the soluble layer and a side surface of the soluble layer. The method includes forming a display panel on the cover layer. The display panel includes a base layer. The method includes removing a portion of the cover layer from the side surface of the soluble layer to form a remaining part. The method includes providing the washing solution to the soluble layer to remove the soluble layer. The method includes separating the display panel and the remaining part from the carrier substrate.

In an exemplary embodiment of the present invention, the soluble layer may include $MoO_3$, and the cover layer and the remaining part may include $MoO_2$.

In an exemplary embodiment of the present invention, the soluble layer and the cover layer may be formed using a sputtering process.

In an exemplary embodiment of the present invention, the forming of the remaining part may be performed using a wet etching process in which an etching solution is provided to the cover layer to remove the portion of the cover layer.

In an exemplary embodiment of the present invention, in the forming of the soluble layer, a plurality of soluble layers may be formed. In the forming of the display panel, a plurality of display panels may be formed, and the display panels may be disposed on the soluble layers in a one-to-one corresponding manner.

In an exemplary embodiment of the present invention, the method may include cutting boundaries between the display panels to separate the display panels from each other. In the forming of the remaining part, a portion of the cover layer may be removed to form a plurality of remaining parts.

In an exemplary embodiment of the present invention, the method may include removing a portion of the cover layer to form a plurality of remaining parts, in the forming of the remaining part. The method may include dissolving the plurality of soluble layers to separate the display panels and the remaining parts from the carrier substrate. The method may include cutting boundaries between the display panels to separate the display panels from each other.

In an exemplary embodiment of the present invention, through-holes may be defined in a region of the carrier substrate, which does not overlap the soluble layers on a plane. An etching solution for removing the portion of the cover layer may pass through the through-holes and may be supplied to the cover layer disposed between the soluble layers.

In an exemplary embodiment of the present invention, the method may include defining through-holes in the carrier substrate. The method may include forming a lower cover layer on a top surface of the carrier substrate. The lower cover layer may be disposed between the carrier substrate and the soluble layer such that top and side surfaces of the soluble layer are covered by the cover layer and a bottom surface of the soluble layer is covered by the lower cover layer.

In an exemplary embodiment of the present invention, the cover layer and the lower cover layer may include a same material as each other. In the removing of the portion of the cover layer to form the remaining part, a portion of the lower cover layer, which overlaps the through-holes on a plane, may be removed.

In an exemplary embodiment of the present invention, in the removing of the soluble layer, the washing solution may be supplied along the side surface of the soluble layer, the through-holes, and the removed portion of the lower cover layer.

In an exemplary embodiment of the present invention, the base layer may include a central region and a peripheral region adjacent to the central region. The remaining part may overlap the central region and need not overlap the peripheral region, on a plane.

In an exemplary embodiment of the present invention, the forming of the display panel may include forming the base layer on the cover layer using a coating process. A circuit layer may be formed on the base layer. A light emitting element layer may be formed on the circuit layer. A thin film encapsulation layer may be formed on the light emitting element layer.

In an exemplary embodiment of the present invention, a stacked substrate includes a carrier substrate and a soluble layer disposed on the carrier substrate. A cover layer is disposed on a top surface of the soluble layer and a side surface of the soluble layer. A display panel includes a base layer which is disposed on the cover layer and includes a central region and a peripheral region adjacent to the central region. The soluble layer overlaps the central region and does not overlap the peripheral region, on a plane.

In an exemplary embodiment of the present invention, a plurality of through-holes may be defined in the carrier substrate. The stacked substrate may include a lower cover layer which covers the plurality of through-holes and is disposed between the carrier substrate and the soluble layer.

In an exemplary embodiment of the present invention, the soluble layer and the display panel may be provided in plurality. The plurality of the soluble layers may be spaced apart from each other, and the cover layer may cover a top surface and a side surface of each of the soluble layers.

In an exemplary embodiment of the present invention, a plurality of through-holes may be defined in a region of the carrier substrate, which does not overlap the soluble layers on plane.

In an exemplary embodiment of the present invention, the soluble layer may include $MoO_3$, and the cover layer may include $MoO_2$.

In an exemplary embodiment of the present invention, a display device includes a display panel including a base layer which includes a central region and a peripheral region adjacent to the central region. A remaining part of a cover layer is disposed under the display panel, and overlaps the central region and does not overlap the peripheral region.

In an exemplary embodiment of the present invention, the remaining part may include $MoO_2$.

BRIEF DESCRIPTION OF THE FIGURES

The above and other features of the present invention will become more apparent by describing in detail exemplary embodiments thereof with reference to the accompanying drawings, in which.

DETAILED DESCRIPTION

Figure 1:
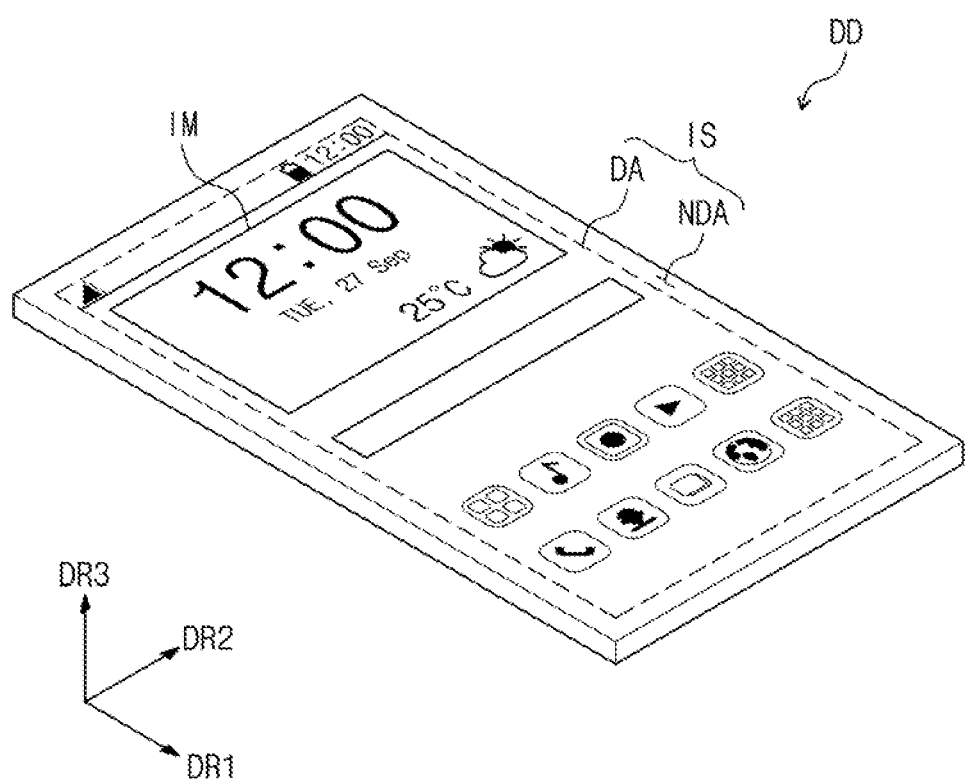
FIG. 1 is a perspective view of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

It will be understood that when a component, such as a layer, a film, a region, or a plate, is referred to as being "on" another component, the component may be directly on the other component or intervening components may be present.

Like reference numerals may refer to like elements throughout the specification and drawings.

In the specification and drawing, the thicknesses, dimensions, and ratios of the components may be exaggerated for clarity of description.

It will be understood that although the terms "first" and "second" may be used herein to describe various components, these components should not be limited by these terms.

FIG. 1 is a perspective view of a display device according to an exemplary embodiment of the present invention.

Referring to FIG. 1, a display device DD may display an image IM through a display surface IS. The display surface IS may be parallel to a surface defined by a first direction DR1 and a second direction DR2 crossing the first direction DR1. However, this is an example, and in an exemplary embodiment of the present invention, a display device may have a curved shape. For example, the display device may be a bendable or foldable display device that is in a curved or bent state at some times and is in a substantially flat state at other times. Alternatively, the display device may be in a permanently folded, curved or bent state.

As an example, the first direction DR1 may be perpendicular to the second direction DR2. The first direction DR1 and the second direction DR2 may define a plane along which the display panel extends. A third direction DR3 may be perpendicular to the first and second direction DR1 and DR2. Thus, the third direction DR3 may be orthogonal to a plane extending in the first and second direction DR1 and DR2.

A normal direction of the display surface IS, for example, a thickness direction of the display device DD may extend in the third direction DR3. A front surface (e.g., a top surface) and a rear surface (e.g., a bottom surface) in each of the members may be spaced apart from each other in the third direction DR3. However, directions that are indicated as the first to third directions DR1, DR2, and DR3 may have a relative concept and thus be changed to other directions. Herein, first to third directions may refer to the same reference symbols as the directions indicated by the first and third directions DR1, DR2, and DR3, respectively.

As an example, the display device DD may be a mobile electronic device. However, the display device DD may be used in relatively large scale electronic devices such as a television, a monitor, an outdoor advertising board, as well as, in relatively small-to-medium scale electronic devices such as a personal computer, a laptop computer, a personal digital terminal, a vehicle navigation unit, a game console, a smart phone, a tablet, or a camera; however, exemplary embodiments of the present invention are not limited thereto, and thus other electronic devices may include the display device DD described herein.

The display surface IS may include a display area DA on which the image IM is displayed and a non-display area NDA adjacent to the display area DA. In the non-display area NDA, an image might not be displayed. In FIG. 1, application icons are illustrated as one example of the image IM. As one example, the display area DA may have a tetragonal shape. The non-display area NDA may surround the display area DA. However, exemplary embodiments of the present invention are not limited thereto, and the shapes of the display area DA and the non-display area NDA may be relatively designed. Also, the non-display area NDA need not be present on a front surface of the display device DD. For example, the non-display area NDA may be positioned at a curved side surface of the display device DD that extends at an angle with respect to the first and second directions DR1 and DR2.

As an example, the non-display region NDA may be arranged at four sides of the display region DA in a plan view; however, exemplary embodiments of the present invention are not limited thereto. For example, the non-display region NDA may be arranged at less than four sides (e.g., three sides) of the display region DA in a plan view.

Figure 2A:
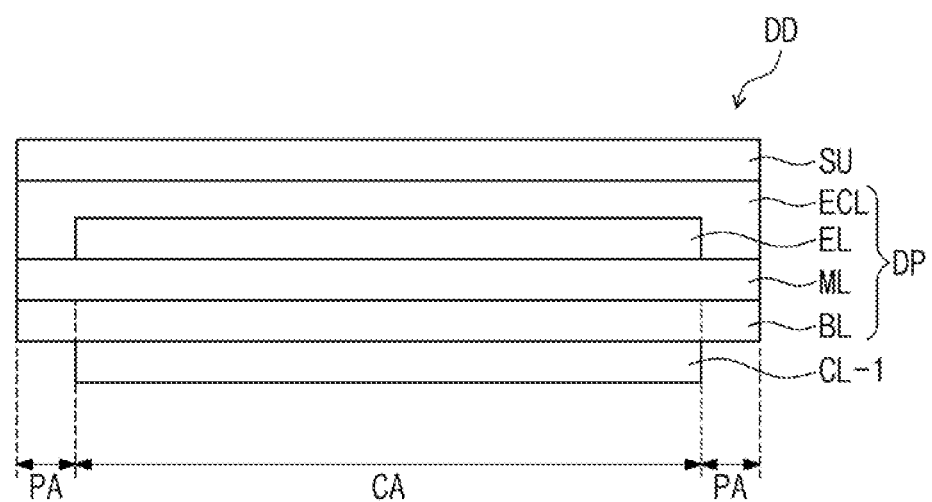
FIG. 2A is a cross-sectional view of the display device of FIG. 1.
Figure 2A:
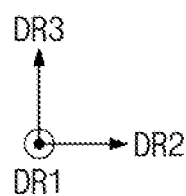
Figure 2B:
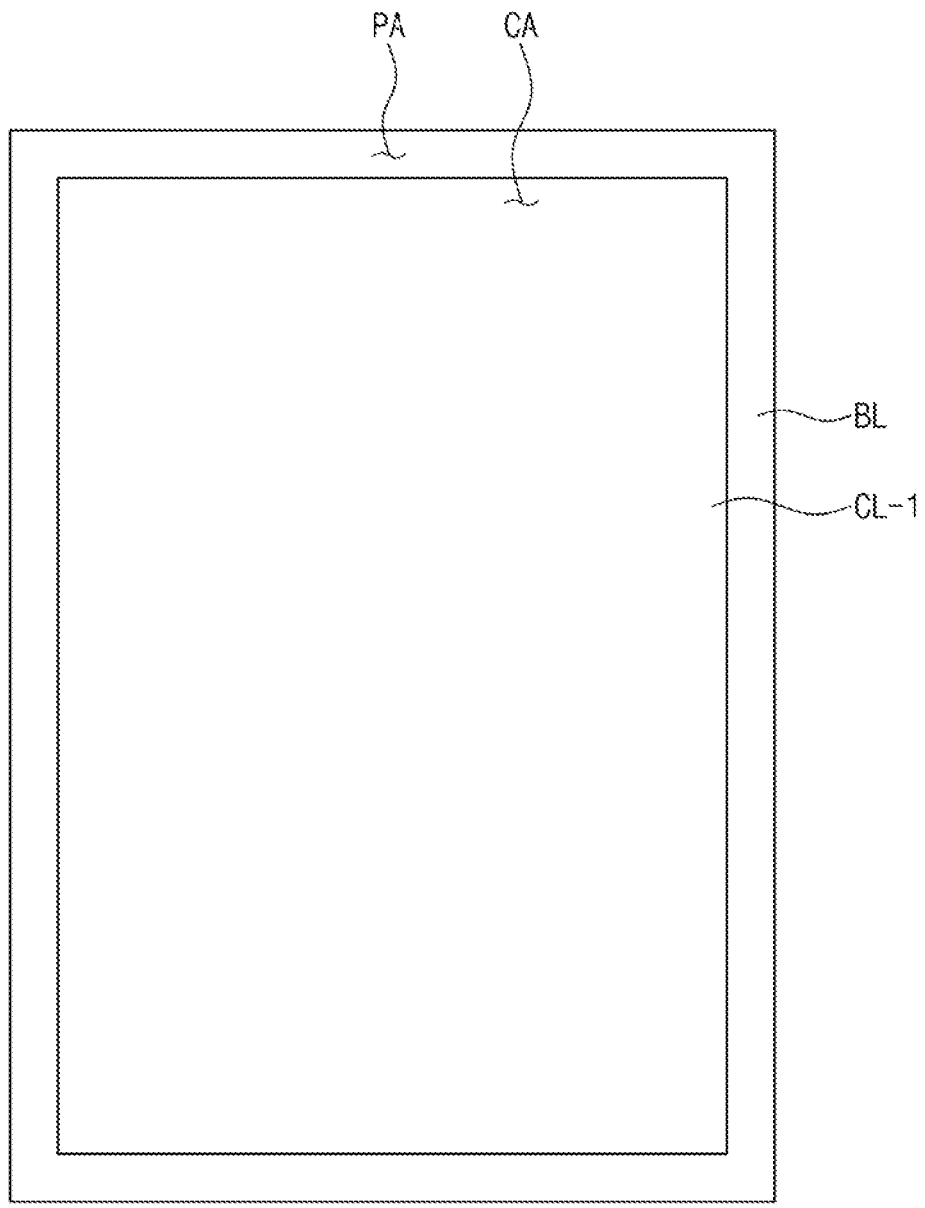
FIG. 2B is a rear view of the display device of FIG. 2A.

FIG. 2A is a cross-sectional view of the display device of FIG. 1. FIG. 2B is a rear view of the display device of FIG. 2A.

Referring to FIGS. 2A and 2B, the display device DD may include a display panel DP, a sensing unit SU, and a remaining part CL-1.

The display panel DP may be a light emitting-type display panel, but is not particularly limited thereto. For example, the display panel DP may be an organic light emitting display panel or a quantum-dot light emitting display panel. A light emitting layer of the organic light emitting display panel may include an organic light emitting material. A light emitting layer of the quantum-dot light emitting display panel may include at least one of quantum dots and quantum rods. The display panel DP is described as an organic light emitting display panel below as an example; however, exemplary embodiments of the present invention are not limited thereto.

The display panel DP may include a base layer BL, a circuit layer ML, a light emitting element layer EL, and a thin film encapsulation layer ECL.

The base layer BL may include an insulation substrate. The base layer BL may have flexible characteristics. The base layer may be optically transparent. As an example, the base layer may be translucent. As an example, the base layer BL may be a stacked structure including a plastic substrate, an organic/inorganic composite material substrate, or a plurality of insulation layers. The base substrate BL may include at least one of polyimide, polycarbonate, polyester, or polyacrylate.

The circuit layer ML may be disposed on the base layer BL. The circuit layer ML may include a plurality of insulation layers, a plurality of conductive layers, and a semiconductor layer. The plurality of conductive layers of the circuit layer ML may include signal lines and a control circuit of a pixel.

The light emitting element layer EL may include, for example, an organic light emitting diode. However, exemplary embodiments of the present invention are not limited thereto, and the light emitting element layer EL may include inorganic light emitting diodes or organic-inorganic hybrid light emitting diodes (e.g., according to the types of the display panel DP).

The thin film encapsulation layer ECL may seal the light emitting element layer EL. The thin film encapsulation layer ECL may include at least one insulation layer. The thin film encapsulation layer ECL according to an exemplary embodiment of the present invention may include at least one encapsulation-organic film and at least one encapsulation-inorganic film.

The encapsulation-inorganic film may protect the light emitting element layer EL against moisture/oxygen, and the encapsulation-organic film may protect the light emitting element layer EL against impurities such as dust particles. The encapsulation-inorganic film may include, but is not particularly limited to, a silicon nitride layer, a silicon oxynitride layer, a silicon oxide layer, a titanium oxide layer, or an aluminum oxide layer. The encapsulation-organic film may include, but is not particularly limited to, an acrylic-based organic film.

The sensing unit SU may be disposed on the thin film encapsulation layer ECL. The sensing unit SU may detect an external input, for example, by a capacitive method. Herein, an operation method of the sensing unit SU is not particularly limited to a particular method, and in an exemplary embodiment of the present invention, the sensing unit SU may detect an external input by a magnetic induction method or a pressure detection method.

As an example, the sensing unit SU may be directly formed on the thin film encapsulation layer ECL. For example, the sensing unit SU and the thin film encapsulation layer ECL may be formed through a single continuous process, but exemplary embodiments of the present invention are not limited thereto. For example, the sensing unit SU may be coupled to the thin film encapsulation layer ECL by an adhesive provided between the thin film encapsulation layer ECL and the sensing unit SU. In an exemplary embodiment of the present invention, the display device DD need not include the sensing unit SU.

The remaining part CL-1 may be disposed under the base layer BL. The remaining part CL-1 may directly contact a rear surface of the base layer BL.

The base layer BL may include a central region CA and a peripheral region PA, which may be adjacent to each other on a plane (e.g., a plane defined by the first and second direction DR1 and DR2). The peripheral region PA may be a region that surrounds the central region CA. On a plane, the remaining part CL-1 may be disposed in the central region CA, and need not be disposed in the peripheral region PA. For example, on a plane, the area of the remaining part CL-1 may be smaller than that of the base layer BL.

As an example, the peripheral region PA may be arranged at four sides of the central region CA in a plan view; however, exemplary embodiments of the present invention are not limited thereto. For example, the peripheral region PA may be arranged at less than four sides (e.g., three sides) of the central region CA in a plan view.

The remaining part CL-1 may include a metal or a metal oxide. For example, the remaining part CL-1 may include at least one of materials which may be wet-etched or dry-etched, such as Al, Mo, Ti, Ag, W, Ta, Nb, or $MoO_2$. However, these are described as examples, and exemplary embodiments of the present invention are not limited thereto.

FIGS. 3A, 3B, 3C, 3D, 3E, 3F, 3O and 3H are cross-sectional views of a method for manufacturing a display device according to an exemplary embodiment of the present invention. A method for manufacturing a display device according to an exemplary embodiment of the present invention will be described in more detail below with reference to FIGS. 3A to 3H.

Figure 3A:
FIGS. 3A, 3B, 3C, 3D, 3E, 3F, 3G and 3H are cross-sectional views of a method for manufacturing a display device according to an exemplary embodiment of the present invention.

Referring to FIG. 3A, a carrier substrate CS may be provided. The carrier substrate CS may be a substrate that moves along a processing line for forming elements of the display device DD (see, e.g., FIG. 2A) in a manufacturing process of the display device DD.

In an exemplary embodiment of the present invention, the carrier substrate CS may have relatively rigid properties and insulating characteristics. The carrier substrate CS may include a material different from that of the base layer BL (see, e.g., FIG. 2A). For example, the carrier substrate CS may include glass.

Figure 3B:
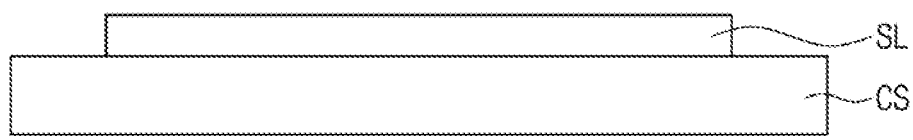
Figure 3C:
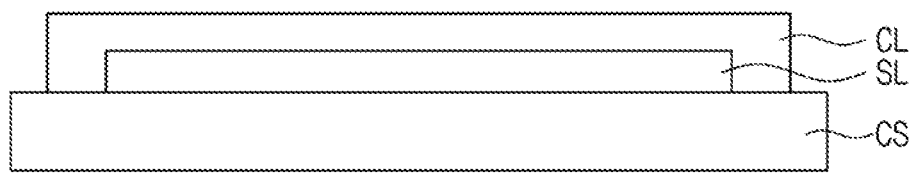

Referring to FIGS. 3B and 3C, after a soluble layer SL is formed on the carrier substrate CS, a cover layer CL may be formed.

The soluble layer SL may include a material that reacts with a washing solution (e.g., washing solution WT described in more detail below). The washing solution may be, for example, de-ionized water. The soluble layer SL may include a material that dissolves in the washing solution. In an exemplary embodiment of the present invention, the soluble layer SL may include $MoO_3$. However, this is described as an example, and exemplary embodiments of the present invention are not limited thereto.

The thickness of the soluble layer SL may be determined in consideration of the rate at which products are manufactured. For example, the thickness of the soluble layer SL may be 100 Å or less (e.g., in consideration of the rate at which a washing is performed by the washing solution). However, this is an example, and exemplary embodiments of the present invention are not limited thereto.

After the soluble layer SL is formed, the cover layer CL may be formed on the soluble layer SL. For example, the cover layer CL may be formed on upper and side surfaces of the soluble layer SL. The cover layer CL may substantially entirely cover the top surface of the soluble layer SL and side surfaces of the soluble layer SL. For example, the soluble layer SL may be substantially completely surrounded by the cover layer CL and the carrier substrate CS. The cover layer CL may prevent the soluble layer SL from dissolving by a washing process during the processes for manufacturing the display panel DP (see, e.g., FIG. 2A). As an example, the soluble layer SL may be dissolved during a washing process that is performed after a portion of the cover layer CL is removed to expose a portion of the soluble layer SL.

The cover layer CL may include a metal or a metal oxide. For example, the cover layer CL may include at least one of materials which may be wet-etched or dry-etched, such as Al, Mo, Ti, Ag, W, Ta, Nb, or $MoO_2$. However, these are described as examples, and the cover layer CL may include a material that may be dry-etched.

In a case in which the soluble layer SL includes $MoO_3$, and the cover layer CL includes $MoO_2$, the processes for forming the soluble layer SL and the cover layer CL may be continuously performed. For example, the soluble layer SL and the cover layer CL may be formed by a sputtering process. In this case, a sputtering target may include a same material as a material included in soluble layer SL and the cover layer CL. Therefore, the processes for forming the soluble layer SL and the cover layer CL may be further simplified and manufacturing costs of the display device may be reduced.

The sputtering target used to form the soluble layer SL and the cover layer CL may include Mo. The soluble layer SL and the cover layer CL may be formed by controlling an oxygen partial pressure, with the use of the same sputtering target. The oxygen partial pressure in forming the soluble layer SL may be, for example, about 87 percent or more, and the oxygen partial pressure in forming the cover layer CL may be about 50 percent to about 85 percent. However, this is an example, and a sputtering condition may be changed.

Figure 3D:
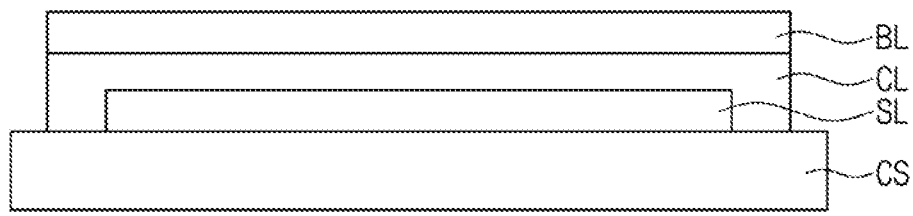

Referring to FIG. 3D, a base layer BL may be formed on the cover layer CL. The base layer BL may include organic films and inorganic films. The organic and inorganic films may be alternately and repeatedly stacked. For example, the organic films may be formed using a coating process, and the inorganic films may be formed using a chemical vapor deposition process. The base layer BL may be spaced apart from the carrier substrate CS with the soluble layer SL and the cover layer CL therebetween. The base layer BL need not contact the carrier substrate CS.

Figure 3E:
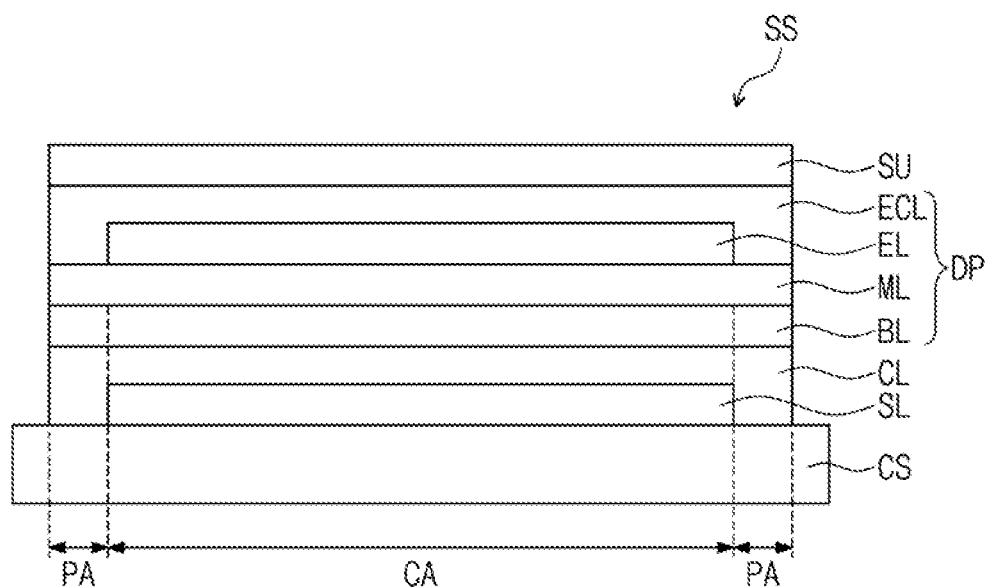

Referring to FIG. 3E, a circuit layer ML, a light emitting element layer EL, a thin film encapsulation layer ECL, and a sensing unit SU may be formed on the base layer BL, thus forming a stacked substrate SS. Therefore, the stacked substrate SS may include the carrier substrate CS, the soluble layer SL, the cover layer CL, the base layer BL, the circuit layer ML, the light emitting element layer EL, the thin film encapsulation layer ECL, and the sensing unit SU. However, this is described as an example, and the sensing unit SU may be omitted.

On a plane, the soluble layer SL may overlap a central region CA of the base layer BL, and need not overlap an outer region PA. As an example, when a first component or layer is described as overlapping a second component or layer herein, it may refer to the first component or layer overlapping the second element or layer along a direction orthogonal to an upper surface of the carrier substrate CS (e.g., along the third direction DR3). As an example, the area of the soluble layer SL may be smaller than that of the display panel DP (e.g., on a plane). Thus, the display panel DP may overhang the soluble layer SL. Therefore, although the cover layer CL may cover the side surface of the soluble layer SL, the outermost portion of the cover layer CL need not exceed the display panel DP. Thus, the display panel DP may also overhang the cover layer CL.

Figure 3F:
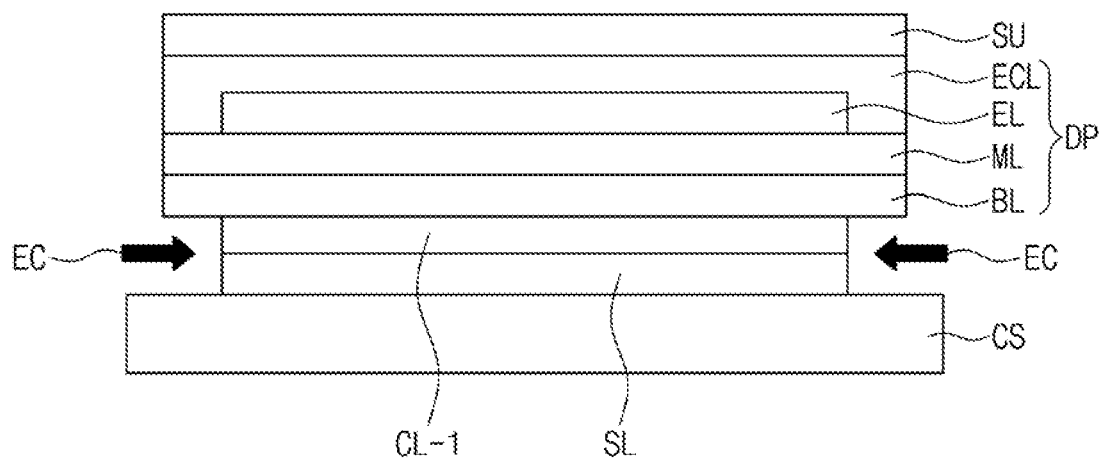

Referring to FIG. 3F, the cover layer CL may be removed to form a remaining part CL-1. For example, an etching solution EC may be supplied to the cover layer CL. A portion of the cover layer CL may be etched by a wet etching process. For example, the portion of the cover layer CL, which is disposed on the side surface of the soluble layer SL, may be etched to form the remaining part CL-1. The removed portion of the cover layer CL may be a portion that has been disposed under the display panel DP. The etching solution EC may be, for example, a solution including at least one or more of phosphoric acid, nitric acid, or acetic acid. However, this is described as an example, and a material included in the etching solution EC is not limited to the above-described example.

The portion of the cover layer CL, which is disposed on the side surface of the soluble layer SL, may be removed such that the side surface of the soluble layer SL may be exposed.

Figure 3G:
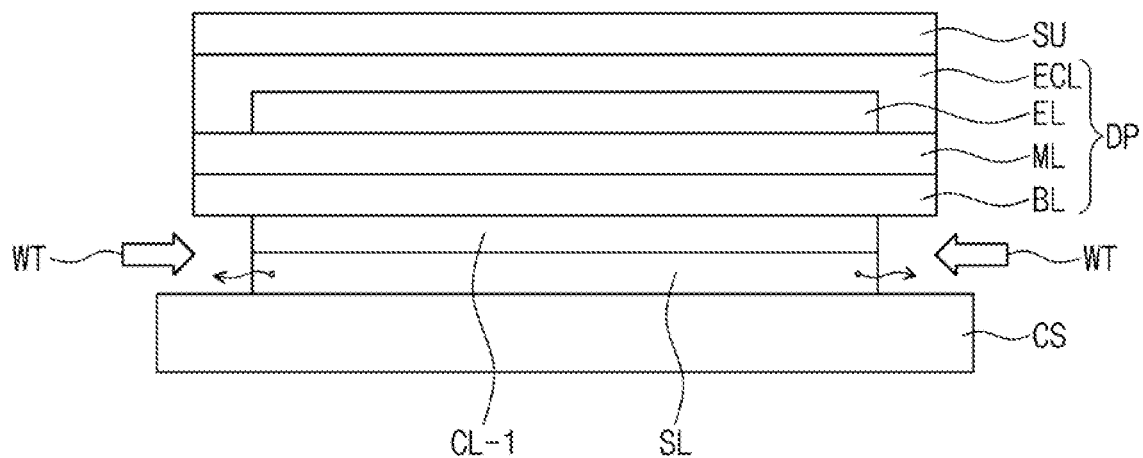

Referring to FIG. 3G, a washing solution WT may be supplied to the soluble layer SL. The material constituting the soluble layer SL, for example, $MoO_3$, may dissolve in the washing solution WT.

Figure 3H:
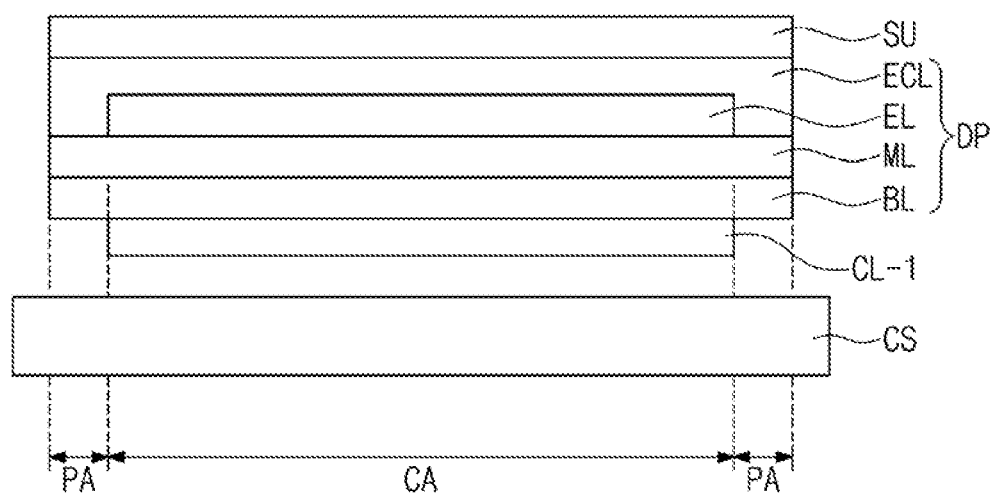

Referring to FIG. 3H, as the soluble layer SL (see, e.g., FIG. 3G) between the remaining part CL-1 and the carrier substrate CS dissolves in the washing solution WT, the display panel DP and the remaining part CL-1 may be separated from the carrier substrate CS. For example, according to an exemplary embodiment of the present invention, a heat treatment process such as a laser process for separating the display panel DP from the carrier substrate CS may be omitted. Therefore, heat damage of the display panel DP may be prevented. Further, manufacturing costs of the display panel D may be reduced.

According to an exemplary embodiment of the present invention, the soluble layer SL and the cover layer CL may be used to separate the display panel DP from the carrier substrate CS. Since the soluble layer SL and the cover layer CL are manufactured by a sputtering process, existing sputtering equipment may be used. Also, according to an exemplary embodiment of the present invention, without using the laser but using the etchant (e.g., etching solution EC) and the washing solution WT, the display panel DP may be separated from the carrier substrate CS. Therefore, the increase in expense due to use of the laser may be prevented.

FIGS. 4A, 4B, 4C, 4D, 4E, 4F, 4G and 4H are cross-sectional views of a method for manufacturing a display device according to an exemplary embodiment of the present invention. A method for manufacturing a display device according to an exemplary embodiment of the present invention will be described in more detail below with reference to FIGS. 4A to 4H.

Figure 4A:
FIGS. 4A, 4B, 4C, 4D, 4E, 4F, 4G and 4H are cross-sectional views of a method for manufacturing a display device according to an exemplary embodiment of the present invention.

Referring to FIG. 4A, a carrier substrate CS-L may be provided. The carrier substrate CS-L may have a size bigger than that of the carrier substrate CS (see, e.g., FIG. 3A). For example, a length and/or width of the carrier substrate CS-L in the first and/or second directions DR1 and DR2 may be greater than that of the carrier substrate CS.

Soluble layers SL-L may be formed on the carrier substrate CS-L. The soluble layers SL-L may be spaced apart from each other. Each of the soluble layers SL-L may include $MoO_3$. For example, the soluble layers SL-L may be spaced apart from each other in the first or second directions DR1 or DR2. As an example, a plurality of soluble layers SL-L may be arranged in rows and columns in a matrix configuration on the carrier substrate CS-L. Thus, the soluble layers of the plurality of soluble layers SL-L may be spaced apart from each other in the first direction DR1 and the second direction DR2.

Figure 4B:
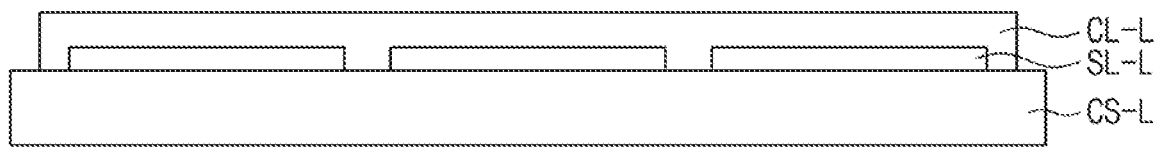

Referring to FIG. 4B, a cover layer CL-L may be formed on the soluble layers SL-L. The cover layer CL-L may be formed on upper and side surfaces of the soluble layers SL-L. The cover layer CL-L may substantially cover all the plurality of soluble layers SL-L. For example, the cover layer CL-L may substantially cover the top surface and side surfaces of each of the soluble layers SL-L.

The soluble layers SL-L and the cover layer CL-L may be formed using a sputtering process. The cover layer CL-L may include a metal or a metal oxide. For example, the cover layer CL-L may include at least one of materials which may be wet-etched or dry-etched, such as Al, Mo, Ti, Ag, W, Ta, Nb, or $MoO_2$.

Figure 4C:
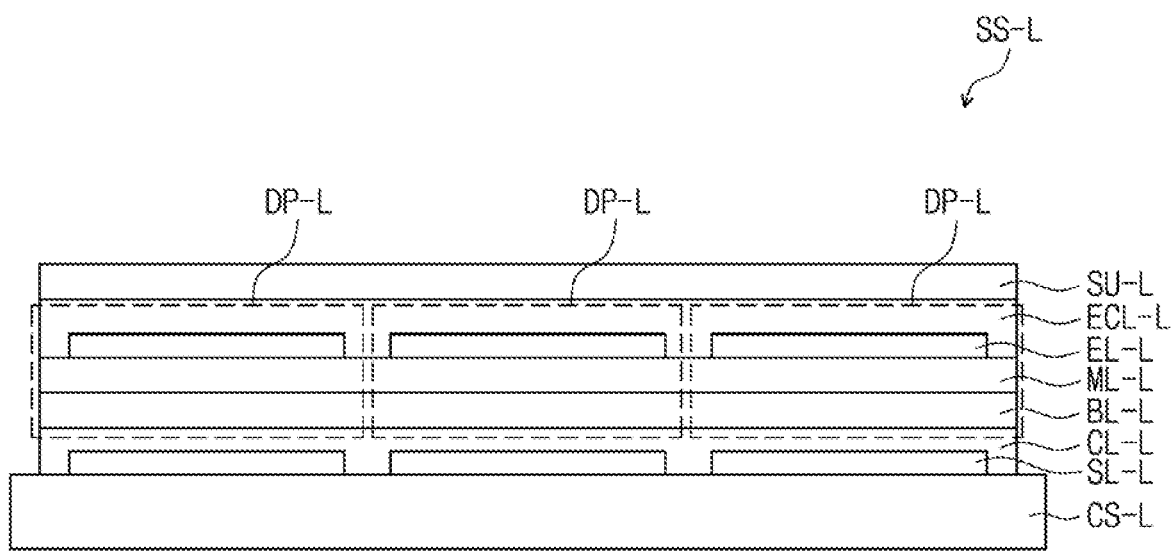

Referring to FIG. 4C, display panels DP-L are formed on the cover layer CL-L, thereby forming a stacked substrate SS-L. Each display panel DP-L may be formed above a corresponding soluble layer SL-L and side surfaces of each display panel DP-L may be aligned with side surfaces of the corresponding soluble layer SL-L along a direction orthogonal to an upper surface of the carrier substrate CS-L (e.g., along the third direction DR3).

The forming of the display panels DP-L may includes forming a base layer BL-L on the cover layer CL-L; forming a circuit layer ML-L on the base layer BL-L; forming light emitting element layers EL-L on the circuit layer ML-L; and forming a thin film encapsulation layer ECL-L on the light emitting element layers EL-L. The thin film encapsulation layer ECL-L may substantially cover the light emitting element layers EL-L (e.g., upper and side surfaces of the light emitting element layers EL-L). The display panels DP-L may have an integrated shape before being separated from each other.

The number of the display panels DP-L may correspond to the number of soluble layers SL-L.

A sensing unit SU-L may be formed on the thin film encapsulation layer ECL-L. In an exemplary embodiment of the present invention, the stacked substrate SS-L may further include the sensing unit SU-L. However, this is an exemplary embodiment, and the stacked substrate SS-L might not include the sensing unit SU-L.

Figure 4D:
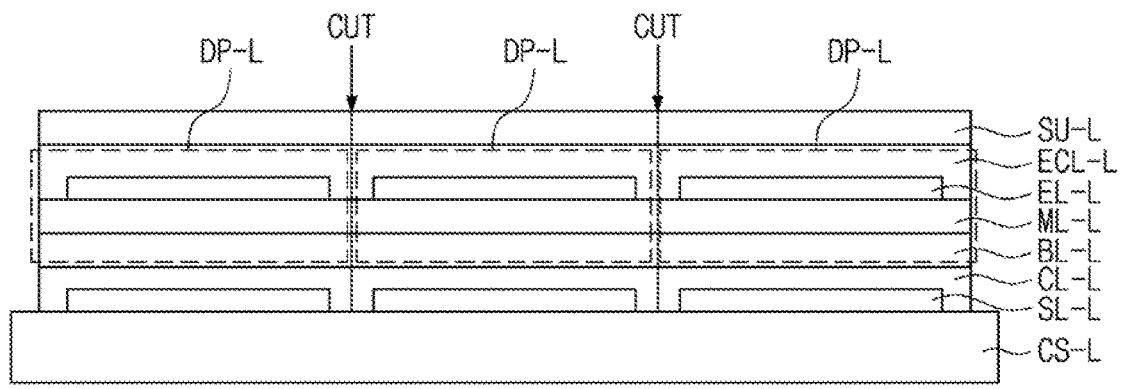

Referring to FIG. 4D, the boundaries between the display panels DP-L may be cut. On a plane (e.g., along the third direction DR3), cut lines need not overlap the soluble layers SL-L. Thus, the soluble layers SL-L need not be cut when the boundaries between the display panels DP-L are cut.

Figure 4E:
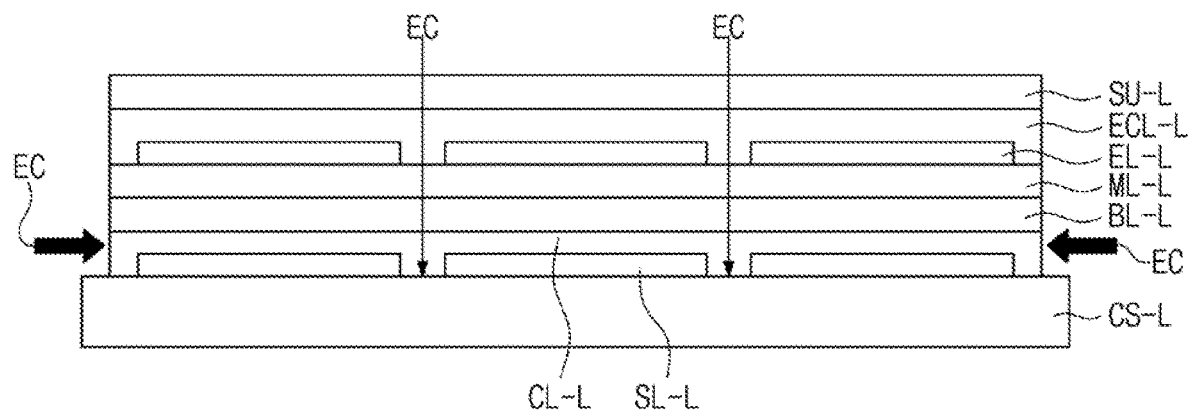

Referring to FIG. 4E, after a cutting (CUT) process, an etching solution EC may be supplied to the cover layer CL-L. The etching solution EC may be also supplied to regions between the display panels DP-L, where gaps are created by the cutting (CUT). Therefore, the etching solution EC may be supplied to the cover layer CL-L disposed between the soluble layers SL-L, as well as the outermost regions of the cover layer CL-L.

Figure 4F:
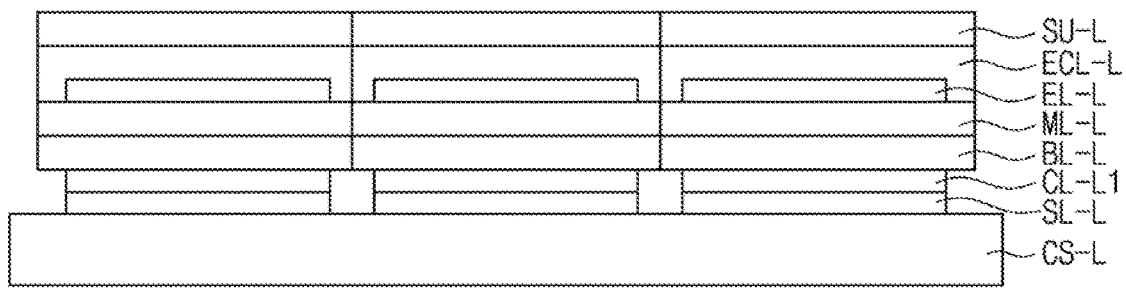

Referring to FIG. 4F, a portion of the cover layer CL-L (e.g., a portion which substantially covers a side surface of each of the soluble layers SL-L), may be etched, thus forming a plurality of remaining parts CL-L1. The remaining parts CL-L1 may respectively be disposed between the soluble layers SL-L and the base layer BL-L. For example, one remaining part CL-L1 may be disposed on one soluble layer SL-L.

Figure 4G:
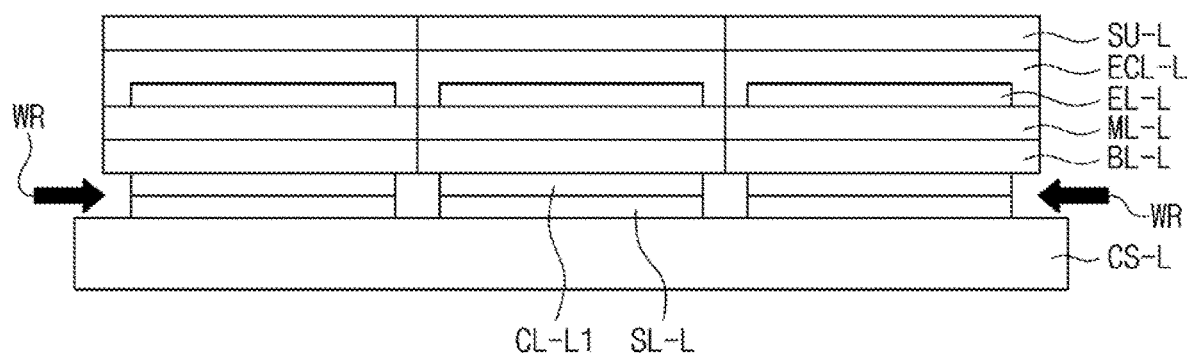

Referring to FIG. 4G, a washing solution WR may be supplied to the soluble layers SL-L. A material included in the soluble layers SL-L, for example, $MoO_3$, may dissolve in the washing solution WR.

Figure 4H:
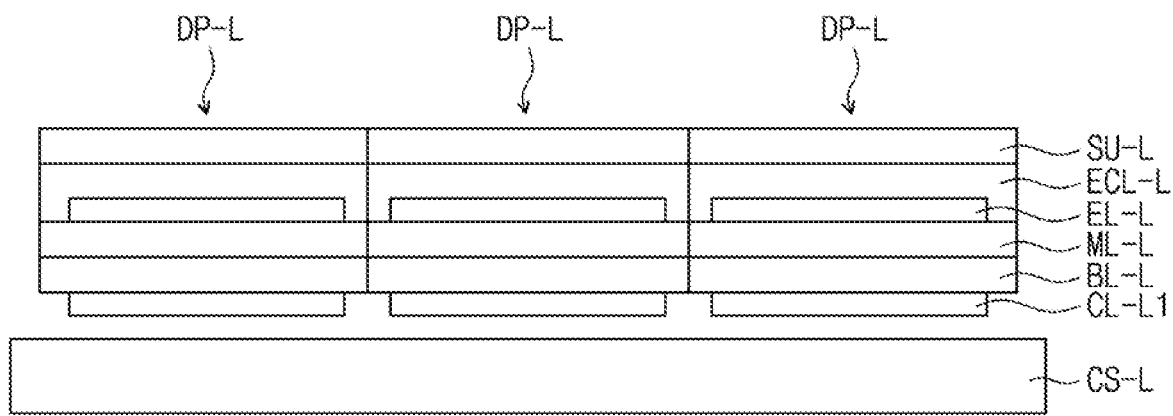

Referring to FIG. 4H, as the soluble layers SL-L dissolve in the washing solution, the display panels DP-L and the remaining parts CL-L1 may be separated from the carrier substrate CS-L.

According to an exemplary embodiment of the present invention, the area of each of the soluble layers SL-L may be smaller than that of each of the display panels DP-L, on a plane (e.g., in the first direction DR1 and/or the second direction DR2). Therefore, although the side surfaces of each of the soluble layers SL-L may be covered by the cover layer CL-L, the display panels DP-L may be disposed adjacent to each other. Therefore, the number of the display panels DP-L, which may be formed on one carrier substrate CS-L, may increase, and the manufacturing yield may be increased.

FIGS. 5A, 5B, 5C, 5D, 5E, 5F, 5G, 5H and 5I are cross-sectional views of a method for manufacturing a display device according to an exemplary embodiment of the present invention. Descriptions of components or layers described above may be similarly applicable to the components or layers described below with reference to FIGS. 5A, 5B, 5C, 5D, 5E, 5F, 5G, 5H and 5I, and thus duplicative descriptions may be omitted below.

Figure 5A:
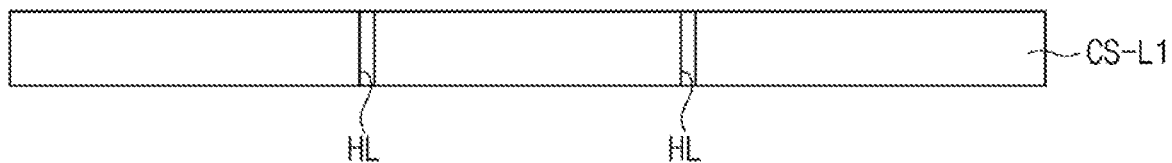
FIGS. 5A, 5B, 5C, 5D, 5E, 5F, 5G, 5H and 5I are cross-sectional views of a method for manufacturing a display device according to an exemplary embodiment of the present invention.

Referring to FIG. 5A, a carrier substrate CS-L1 may be provided. Through-holes HL may be provided in the carrier substrate CS-L1. For example, a through-hole HL may be formed to completely penetrate the carrier substrate CS-L1. Each of the through-holes HL may extend from the top surface of the carrier substrate CS-L1 to the bottom surface of the carrier substrate CS-L1. For example, when a solution is supplied to the bottom surface of the carrier substrate CS-L1, the solution may pass through the through-holes HL and move to the top surface of the carrier substrate CS-L1.

Figure 5B:
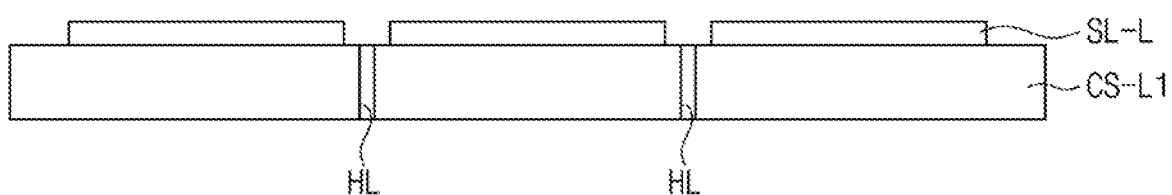

Referring to FIG. 5B, soluble layers SL-L may be formed on the carrier substrate CS-L1. The soluble layers SL-L might not cover the through-holes HL. Therefore, the soluble layers SL-L may be spaced apart from the through-holes HL, on a plane. For example, the soluble layers might not overlap the through-holes HL along a direction orthogonal to an upper surface of the carrier substrate CS-L1 (e.g., along the third direction DR3).

Figure 5C:
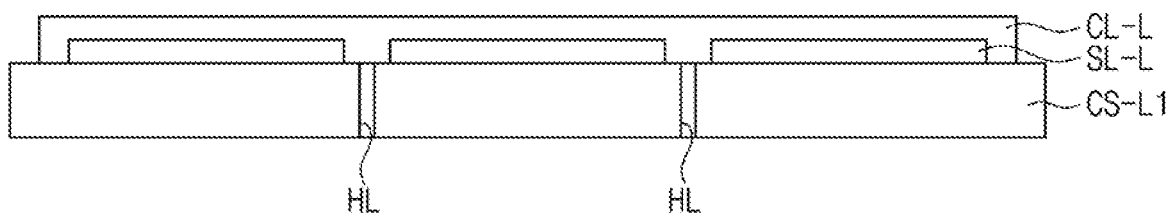

Referring to FIG. 5C, a cover layer CL-L may be formed on the soluble layers SL-L. The cover layer CL-L may substantially entirely cover the top surface and side surfaces of each of the soluble layers SL-L. The through-holes HL, which may be present between the soluble layers SL-L, may be covered by the cover layer CL-L.

Figure 5D:
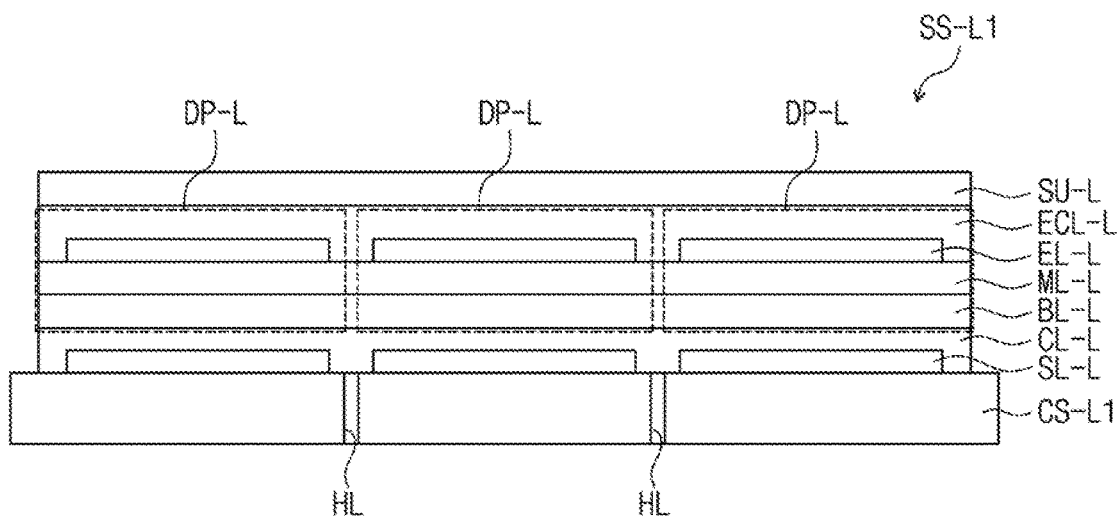

Referring to FIG. 5D, a base layer BL-L, a circuit layer ML-L, light emitting element layers EL-L, a thin film encapsulation layer ECL-L, and a sensing unit SU-L may be formed on the cover layer CL-L, thus forming a stacked substrate SS-L1. The stacked substrate SS-L1 may include a plurality of display panels DP-L. The display panels DP-L may have an integrated shape before being separated from each other.

Figure 5E:
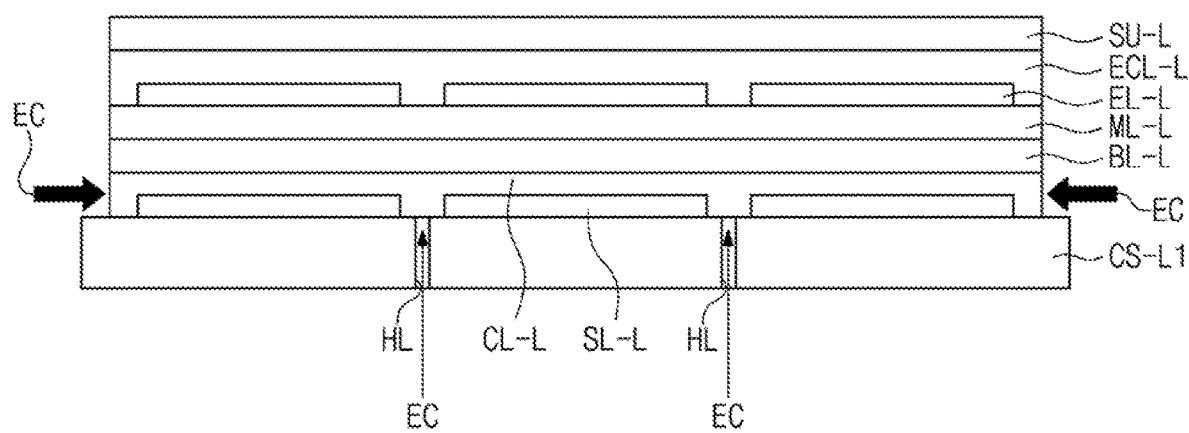

Referring to FIG. 5E, an etching solution EC may be supplied to the cover layer CL-L. The etching solution EC may be also supplied, through the through-holes HL, to the cover layer CL-L between the soluble layers SL-L. The regions of the cover layer CL-L between the soluble layers SL-L as well as the outermost regions thereof may be etched by the etching solution EC.

Figure 5F:
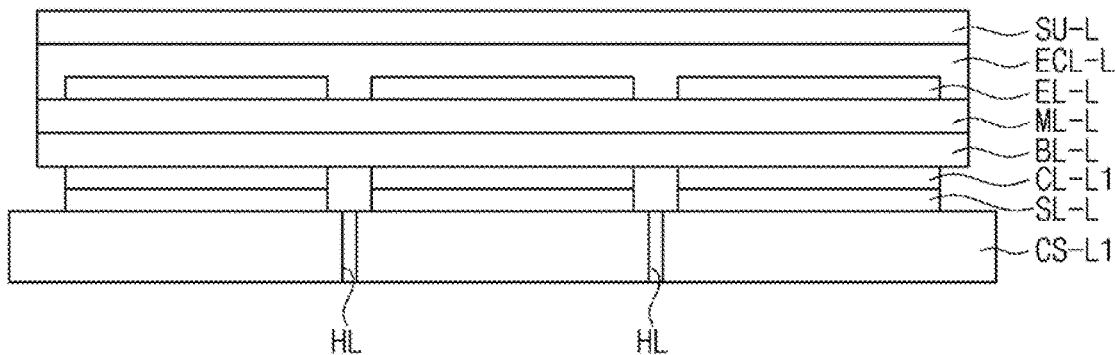

Referring to FIG. 5F, a portion of the cover layer CL-L, which substantially covers a side surface of each of the soluble layers SL-L, may be etched, thus forming a plurality of remaining parts CL-L1. The remaining parts CL-L1 may be disposed on the soluble layers SL-L. For example, the remaining parts CL-L1 may be disposed between the soluble layers SL-L and the base layer BL-L.

Figure 5G:
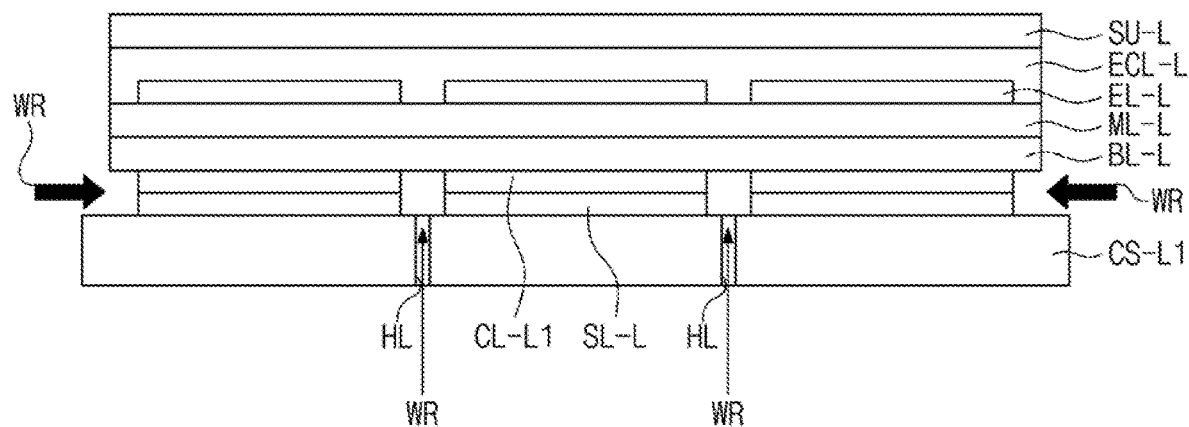

Referring to FIG. 5G, a washing solution WR may be supplied to the soluble layers SL-L. The washing solution WR may be also supplied, through the through-holes HL, to the soluble layers SL-L. Therefore, the rate at which the soluble layers SL-L dissolve may be further increased.

Figure 5H:
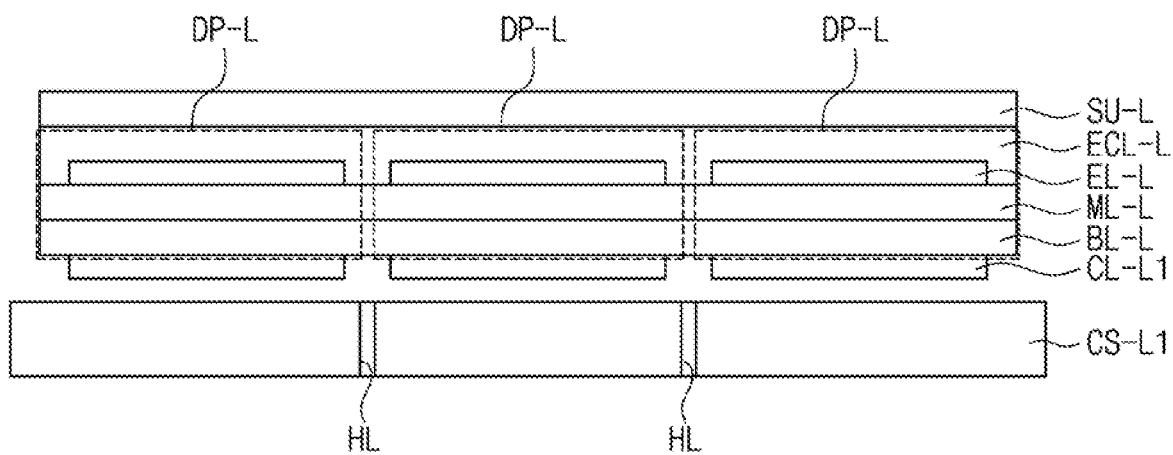

Referring to FIG. 5H, when the soluble layers SL-L between the remaining parts CL-L1 and the carrier substrate CS-L1 dissolve in the washing solution, the display panels DP-L and the remaining parts CL-L1 may be separated from the carrier substrate CS-L1. The display panels DP-L may be separated from the carrier substrate CS-L1 while in a combined state before they are separated from each other.

Figure 5I:
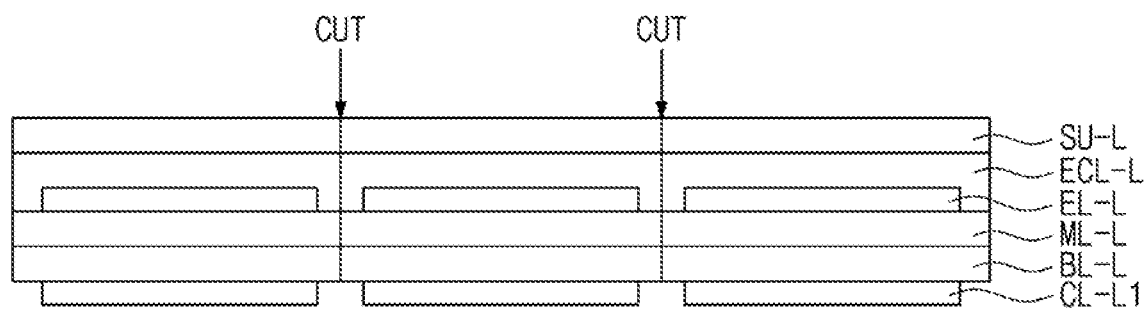

Referring to FIG. 5I, after the display panels DP-L are separated from the carrier substrate CS-L1, a cutting (CUT) may be performed between the display panels DP-L to separate the display panels DP-L from each other. However, exemplary embodiments of the present invention are not limited thereto and the cutting (CUT) may be formed substantially simultaneously with separating the display panels DP-L from the carrier substrate CS-L1. Alternatively, the cutting (CUT) may be performed before the display panels DP-L are separated from the carrier substrate CS-L1.

FIGS. 6A, 6B, 6C, 6D, 6E, 6F, 6G, 6H and 6I are cross-sectional views of a method for manufacturing a display device according to an exemplary embodiment of the present invention.

Figure 6A:
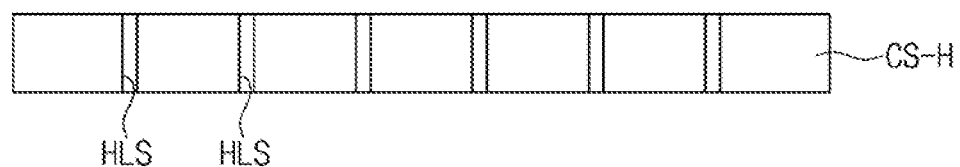
FIGS. 6A, 6B, 6C, 6D, 6E, 6F, 6G, 6H and 6I are cross-sectional views of a method for manufacturing a display device according to an exemplary embodiment of the present invention.

Referring to FIG. 6A, a carrier substrate CS-H may be provided. Through-holes HLS may be provided in the carrier substrate CS-H. For example, the through-holes HLS may be formed to completely penetrate the carrier substrate CS-H. Each of the through-holes HLS may extend from the top surface of the carrier substrate CS-H to the bottom surface of the carrier substrate CS-H.

Figure 6B:
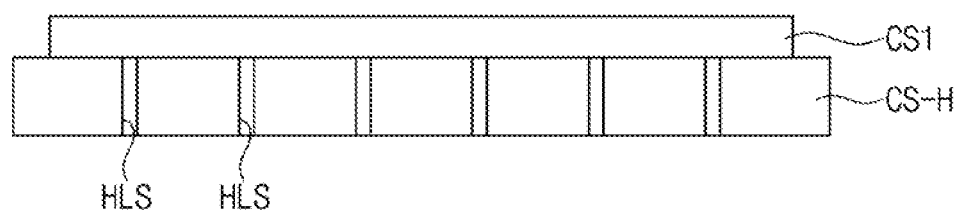

Referring to FIG. 6B, a first cover layer CS1 may be formed on the top surface of the carrier substrate CS-H. The first cover layer CS1 may substantially cover the through-holes HLS. The first cover layer CS1 may include a metal or a metal oxide. For example, the first cover layer CS1 may include at least one of materials which may be wet-etched or dry-etched, such as Al, Mo, Ti, Ag, W, Ta, Nb, or $MoO_2$.

Figure 6C:
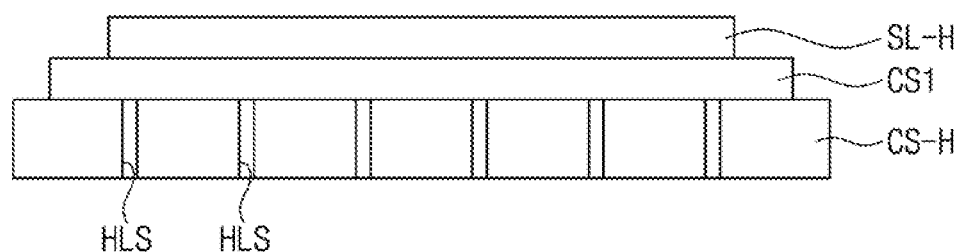

Referring to FIG. 6C, a soluble layer SL-H may be formed on the first cover layer CS1. On a plane (e.g., a plane defined by the first direction DR1 and the second direction DR2), the area of the soluble layer SL-H may be smaller than that of the first cover layer CS1. The soluble layer SL-H may include a material that dissolves in a washing solution such as $MoO_3$. The first cover layer CS1 may be disposed under the soluble layer SL-H. The first cover layer CS1 may be referred to as a lower cover layer.

Figure 6D:
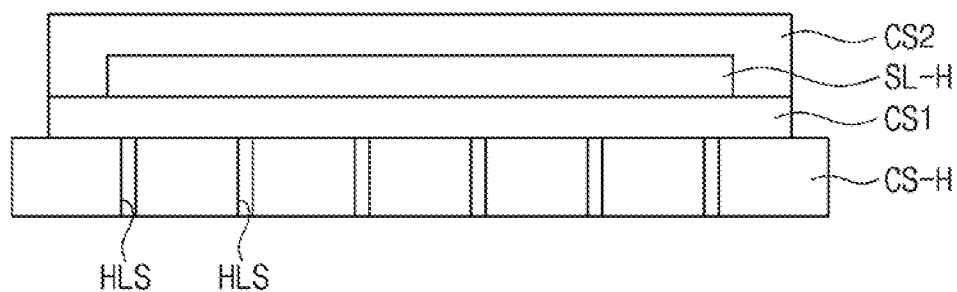

Referring to FIG. 6D, a second cover layer CS2 substantially covering the soluble layer SL-H may be formed. The second cover layer CS2 may include a metal or a metal oxide. For example, the second cover layer CS2 may include at least one of materials which may be wet-etched or dry-etched, such as Al, Mo, Ti, Ag, W, Ta, Nb, or $MoO_2$. When the first cover layer CS1 and the second cover layer CS2 include $MoO_2$, the first cover layer CS1, the soluble layer SL-H, and the second cover layer CS2 may be formed by the same sputtering process. For example, a sputtering target may be Mo, and each layer may be formed by controlling an oxygen partial pressure.

The second cover layer CS2 may substantially cover the top surface of the soluble layer SL-H and the side surfaces of the soluble layer SL-H. Therefore, the soluble layer SL-H may be completely sealed by the first cover layer CS1 and the second cover layer CS2.

The first cover layer CS1 and the second cover layer CS2 may prevent the soluble layer SL-H from dissolving by a washing process in the processes for manufacturing the display panel DP (see, e.g., FIG. 2A). For example, the first cover layer CS1 may prevent the soluble layer SL-H from dissolving by a washing solution that is introduced through the through-holes HLS.

Figure 6E:
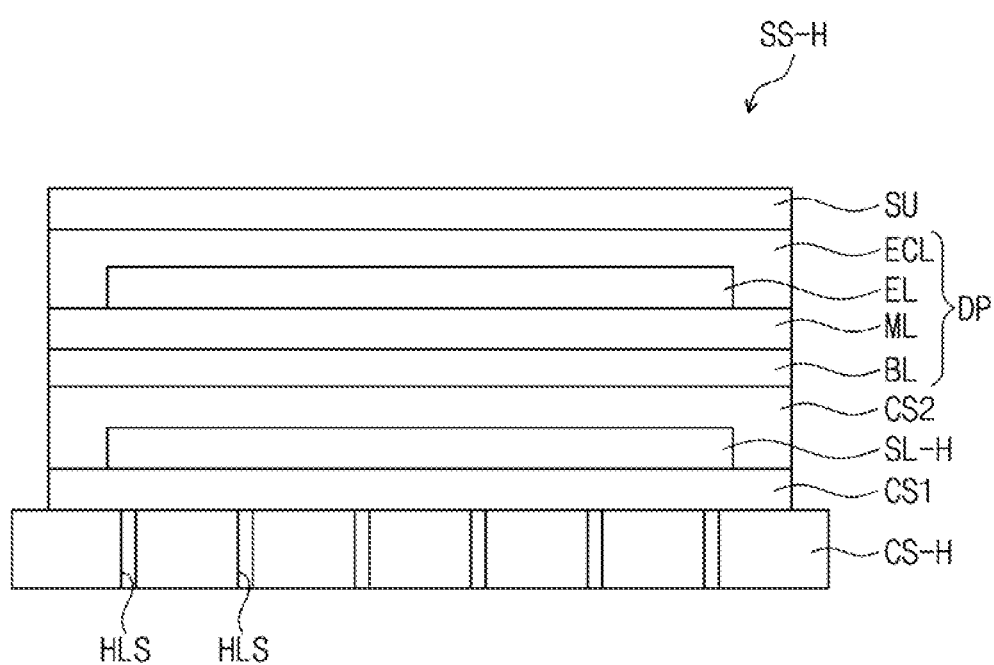

Referring to FIG. 6E, a base layer BL may be formed on the second cover layer CS2. A circuit layer ML, a light emitting element layer EL, a thin film encapsulation layer ECL, and a sensing unit SU are formed on the base layer BL, thus forming a stacked substrate SS-H.

Figure 6F:
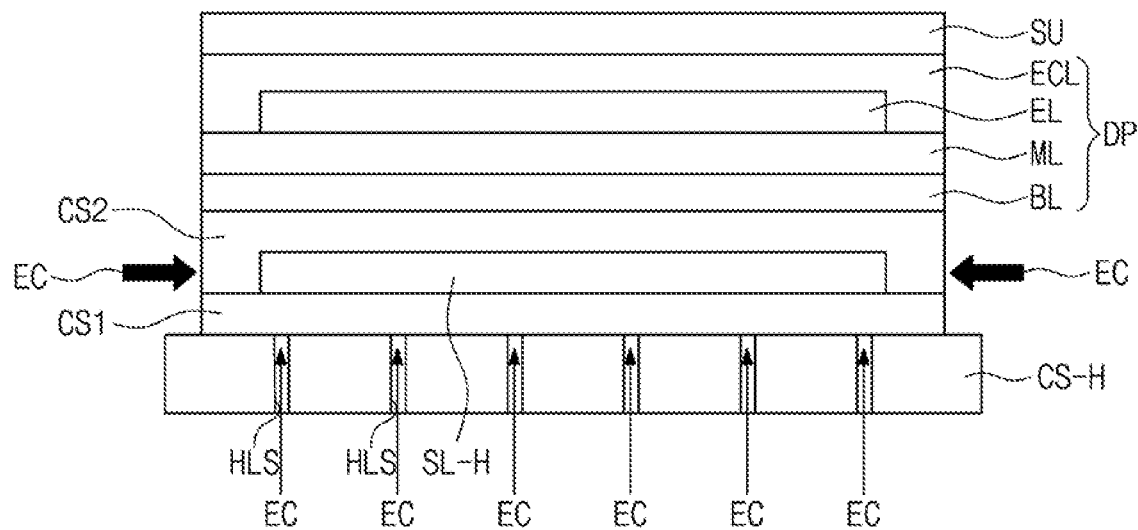

Referring to FIG. 6F, an etching solution EC may be supplied to the first cover layer CS1 and the second cover layer CS2. The etching solution EC may etch the second cover layer CS2, which substantially covers the side surface of the soluble layer SL-H, such that the soluble layer SL-H may be exposed. The etching solution EC may etch the second cover layer CS2 such that a remaining part CL-H may be formed. Also, the etching solution EC may etch the outermost portion of the first cover layer CS1. The etching solution EC may pass through the through-holes HLS to etch a portion of the first cover layer CS1 disposed under the soluble layer SL-H.

Figure 6G:
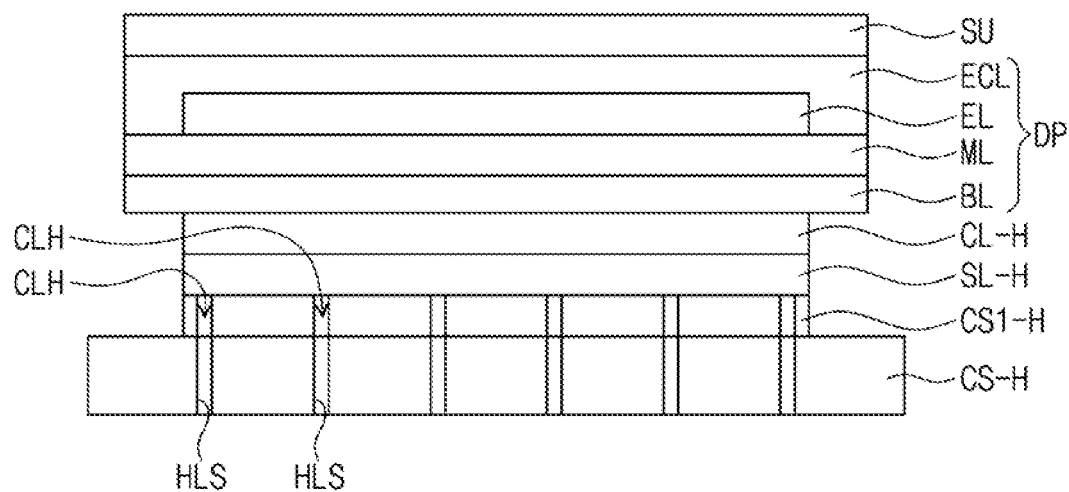

Referring to FIG. 6G, a plurality of holes CLH may be formed in a first cover layer CS1-H formed by etching the first cover layer CS1. The plurality of through-holes HLS may be connected to the plurality of holes CLH. Therefore, when a solution is supplied to the bottom surface of the carrier substrate CS-H, the solution may pass through the through-holes HLS and the holes CLH and may contact the soluble layer SL-H.

Figure 6H:
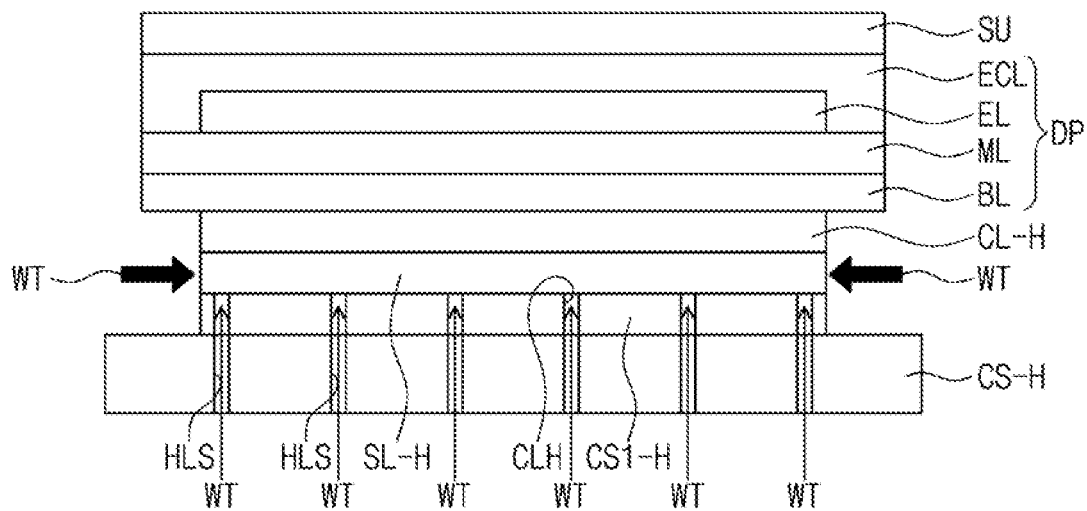

Referring to FIG. 6H, a washing solution WT may be supplied to the soluble layer SL-H. The washing solution WT may be also supplied, through the through-holes HLS, to the soluble layer SL-H. Therefore, the rate at which the soluble layer SL-H dissolves may be further increased.

Figure 6I:
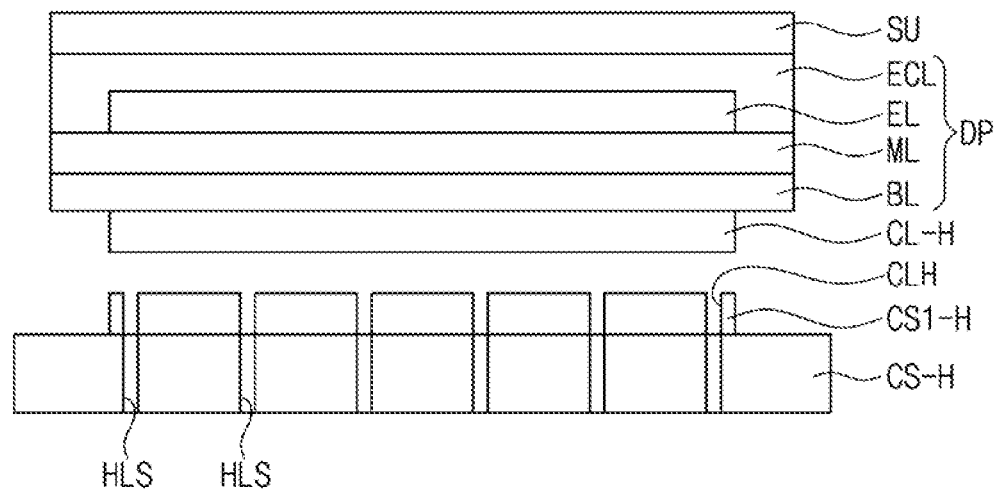

Referring to FIG. 6I, as the soluble layer SL-H between the remaining part CL-H and the first cover layer CS1-H dissolves in the washing solution, the display panel DP and the remaining part CL-H may be separated from the carrier substrate CS-H and the first cover layer CS1-H.

According to an exemplary embodiment of the present invention, a method for manufacturing a display device may include providing the carrier substrate CS-H and forming the first cover layer CS1 on the carrier substrate CS-H. The method may include forming the soluble layer SL-H on the first cover layer CS1. The method may include forming the second cover layer CS2 on the soluble layer SL-H. The method may include forming the display panel DP on the second cover layer CS2. The method may include forming the through hole HLS penetrating the carrier substrate CS-H and the first cover layer CS1. The method may include passing the washing solution WT through the through hole HLS to contact the soluble layer SL-H to remove the soluble layer SL-H between the first cover layer CS1 and the second cover layer CS2; and separating the display panel DP from the carrier substrate CS-H.

In an exemplary embodiment of the present invention, the method for manufacturing a display device may include etching side surfaces of the first cover layer CS1 and the second cover layer CS2 such that widths of the first cover layer CS1, the second cover layer CS2 and the soluble layer SL-H are narrower than a width of the display panel DP.

Figure 7A:
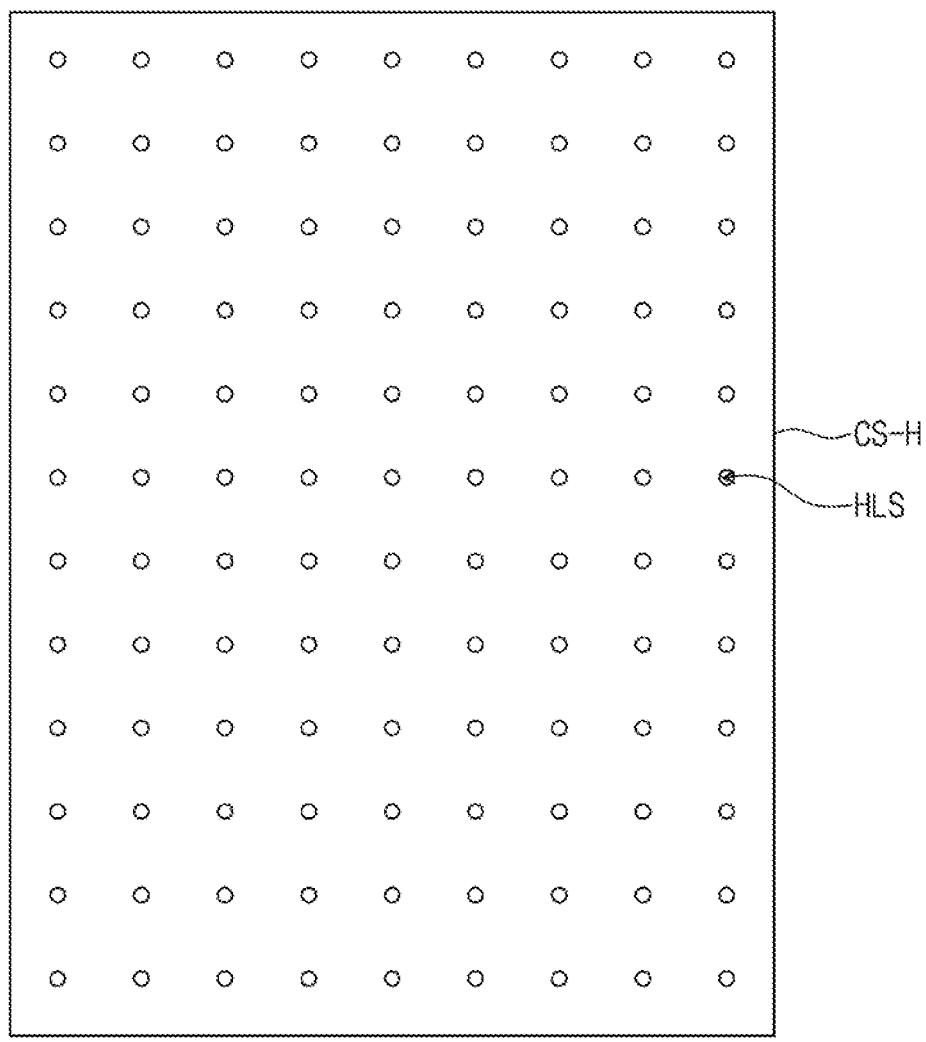
FIG. 7A is a plan view of a carrier substrate according to an exemplary embodiment of the present invention.

FIG. 7A is a plan view of a carrier substrate according to an exemplary embodiment of the present invention.

Referring to FIG. 7A, through-holes HLS may be provided in a carrier substrate CS-H. Each of the through-holes HLS may have a circular edge, on a plane. For example, each of the through-holes HLS may have a cylindrical shape extending in the third direction DR3. The through-holes HLS may be spaced apart from each other (e.g., in the first and/or second direction DR1 and/or DR2) and may be disposed in matrix form.

However, this is described as an example, and each of the through-holes HLS may have a polygonal edge.

Figure 7B:
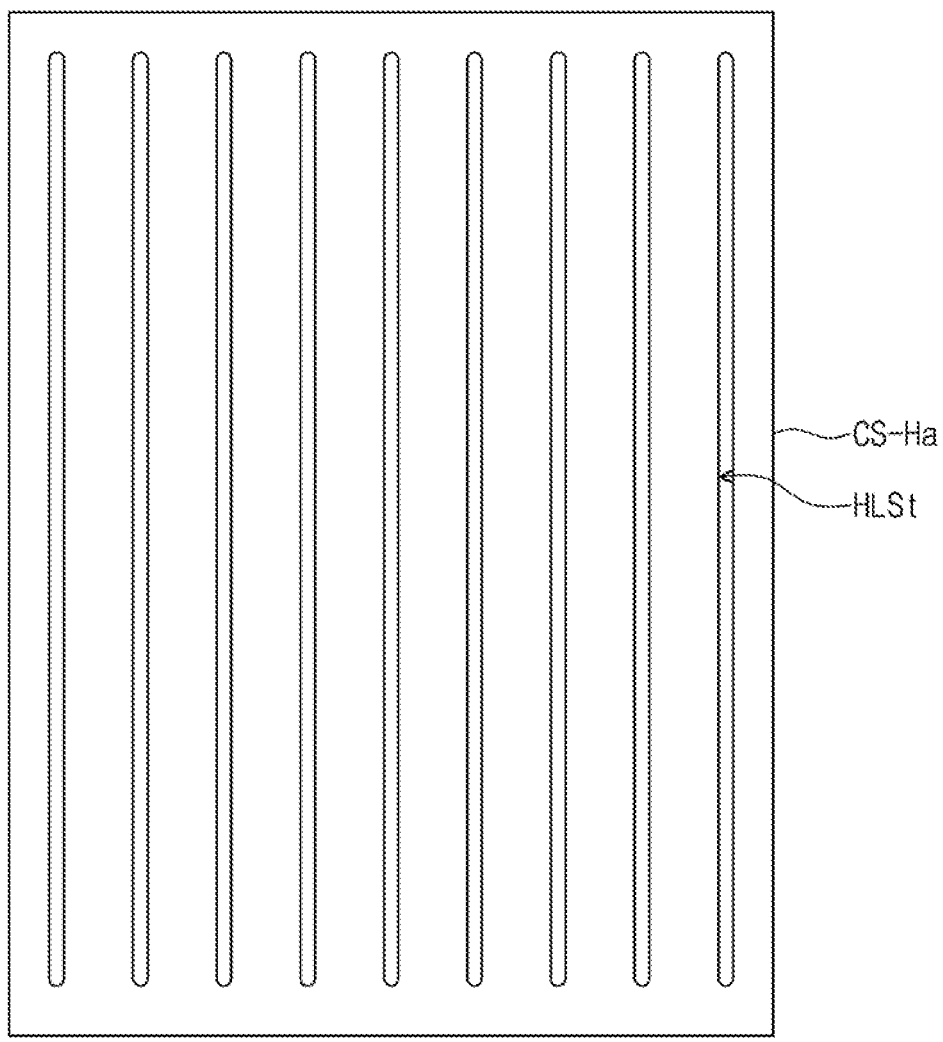
FIG. 7B is a plan view of a carrier substrate according to an exemplary embodiment of the present invention.

FIG. 7B is a plan view of a carrier substrate according to an exemplary embodiment of the present invention.

Referring to FIG. 7B, through-holes HLSt may be provided in a carrier substrate CS-Ha according to an exemplary embodiment of the present invention. On a plane (e.g., a plane defined by the first and second directions DR1 and DR2), each of the through-holes HLSt may have a slit shape extending in a predetermined direction (e.g., in the first direction or the second direction DR1 or DR2). As an example, each of the through-holes HLSt may have a slit with a same length, but exemplary embodiments of the present invention are not limited thereto. The lengths of the through-holes HLSt may be different from each other, and may be arranged in various forms.

According to an exemplary embodiment of the present invention, the display device including the base substrate, which is prevented from being damaged due to the laser, may be provided. Also, according to an exemplary embodiment of the present invention, the stacked substrate, in which the base layer is relatively easily separable from the carrier substrate, may be provided, which may simplify a manufacturing processes. In addition, according to an exemplary embodiment of the present invention, the base layer may be stably separated from the carrier substrate without laser irradiation, which may increase the process reliability in manufacturing the display device. For example, an occurrence of heat damage during a heat treatment process, such as a laser irradiation process, may be eliminated.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A method for manufacturing a display device, comprising:
   providing a carrier substrate;
   forming a soluble layer on the carrier substrate, the soluble layer comprising a material that dissolves in a washing solution;
   forming a cover layer on a top surface of the soluble layer and a side surface of the soluble layer;
   forming a display panel on the cover layer, the display panel comprising a base layer;
   removing a portion of the cover layer from the side surface of the soluble layer to form a remaining part of the cover layer;
   providing the washing solution to the soluble layer to remove the soluble layer; and
   separating the display panel and the remaining part from the carrier substrate.

2. The method of claim 1, wherein the soluble layer includes Molybdenum trioxide ($MoO_3$), and the cover layer and the remaining part include Molybdenum dioxide ($MoO_2$).

3. The method of claim 1, wherein the soluble layer and the cover layer are formed using a sputtering process.

4. The method of claim 1, wherein the forming of the remaining part is performed using a wet etching process in which an etching solution is provided to the cover layer to remove the portion of the cover layer.

5. The method of claim 1, wherein, in the forming of the soluble layer, a plurality of soluble layers are formed, and
   in the forming of the display panel, a plurality of display panels are formed, and the display panels are disposed on the soluble layers in a one-to-one corresponding manner.

6. The method of claim 5, further comprising cutting boundaries between the display panels to separate the display panels from each other,
   wherein, in the forming of the remaining part, a portion of the cover layer is removed to form a plurality of remaining parts.

7. The method of claim 5, further comprising:
   removing a portion of the cover layer to form a plurality of remaining parts, in the forming of the remaining part; and
   dissolving the plurality of soluble layers to separate the display panels and the remaining parts from the carrier substrate, and cutting boundaries between the display panels to separate the display panels from each other.

8. The method of claim 5, wherein through-holes are defined in a region of the earner substrate, which does not overlap the soluble layers on a plane, and an etching solution for removing the portion of the cover layer passes through the through-holes and is supplied to the cover layer disposed between the soluble layers.

9. The method of claim 1, further comprising defining through-holes in the carrier substrate, and forming a lower cover layer, which covers the through-holes, on a top surface of the carrier substrate, wherein the lower cover layer is disposed between the carrier substrate and the soluble layer such that top and side surfaces of the soluble layer are covered by the cover layer and a bottom surface of the soluble layer is covered by the lower cover layer.

10. The method of claim 9, wherein the cover layer and the lower cover layer comprise a same material as each other, and in the removing of the portion of the cover layer to form the remaining part, a portion of the lower cover layer, which overlaps the through-holes on a plane, is removed.

11. The method of claim 10, wherein, in the removing of the soluble layer, the washing solution is supplied along the side surface of the soluble layer, the through-holes, and the removed portion of the lower cover layer.

12. The method of claim 1, wherein the base layer includes a central region and a peripheral region adjacent to the central region, and the remaining part overlaps the central region and does not overlap the peripheral region, on a plane.

13. The method of claim 1, wherein the forming of the display panel comprises:

forming the base layer on the cover layer using a coating process;

forming a circuit layer on the base layer;

forming a light emitting element layer on the circuit layer; and forming a thin film encapsulation layer on the light emitting element layer.

* * * * *